United States Patent
Kagawa

[19]

[11] Patent Number: 5,914,637
[45] Date of Patent: Jun. 22, 1999

[54] GAIN-VARIABLE AMPLIFIER WITH WIDE CONTROL RANGE

[75] Inventor: Shigeru Kagawa, Tokyo, Japan

[73] Assignee: NEC Corporation, Tokyo, Japan

[21] Appl. No.: 08/869,903

[22] Filed: Jun. 5, 1997

[30] Foreign Application Priority Data

Jun. 7, 1996 [JP] Japan ................................... 8-168393

[51] Int. Cl.⁶ .................................................. H03F 3/45
[52] U.S. Cl. ........................................................ 330/254
[58] Field of Search .............................. 327/359; 330/254, 330/278, 279; 348/678

[56] References Cited

U.S. PATENT DOCUMENTS 4,287,476  9/1981  Cense ....................................... 330/254
4,388,540  6/1983  Schreurs ............................... 330/254 X
4,695,806  9/1987  Barrett ..................................... 330/254

FOREIGN PATENT DOCUMENTS 63-276309  11/1988  Japan .

*Primary Examiner*—Steven Mottola
*Attorney, Agent, or Firm*—Young & Thompson

[57] ABSTRACT

In a gain-variable amplifier including a dual differential amplifier circuit for amplifying an input voltage to generate an output voltage with a gain in accordance with first and second control voltages, and a control voltage generating circuit, for generating the first and second control voltages in accordance with a gain control voltage, a polarity of a difference between the first and second control voltages is unchanged, when the gain control voltage is within a control range.

17 Claims, 8 Drawing Sheets

GAIN-VARIABLE AMPLIFIER WITH WIDE CONTROL RANGE

BACKGROUND OF THE INVENTION

1. Field of the Invention

The present invention relates to a gain-variable amplifier.

2. Description of the Related Art

A prior art gain-variable amplifier includes a dual differential amplifier circuit for amplifying an input voltage to generate an output voltage with a gain in accordance with first and second control voltages, and a control voltage generating circuit for generating the first and second control voltages in accordance with a gain control voltage, a polarity of a difference between the first and second control voltages is changed, when the gain control voltage is within a control range. This will be explained later in detail.

In the prior art gain-variable amplifier, however, since the gain characteristics have an inflection point with respect to the gain control voltage, it is difficult to control the gain by the gain control voltage. Also, the phase of an output voltage is inverted at the inflection point. This substantially reduces a control range of gain by the gain control voltage.

SUMMARY OF THE INVENTION

It is an object of the present invention to easily control a gain-variable amplifier by a gain control voltage.

Another object is to provide a gain-variable amplifier with no inversion of phase of an output voltage.

According to the present invention, in a gain-variable amplifier including a dual differential amplifier circuit for amplifying an input voltage to generate an output voltage with a gain in accordance with first and second control voltages, and a control voltage generating circuit, for generating the first and second control voltages in accordance with a gain control voltage, a polarity of a difference between the first and second control voltages is unchanged, when the gain control voltage is within a control range. Thus, no inflection point is generated in the gain characteristics.

BRIEF DESCRIPTION OF THE DRAWINGS

The present invention will be more clearly understood from the description as set forth below as compared with the prior art, with reference to the accompanying drawings, wherein.

DESCRIPTION OF THE PREFERRED EMBODIMENTS

Before the description of the preferred embodiments, a prior art gain-variable amplifier will be explained with reference to FIGS. 1 and 2.

Figure 1:
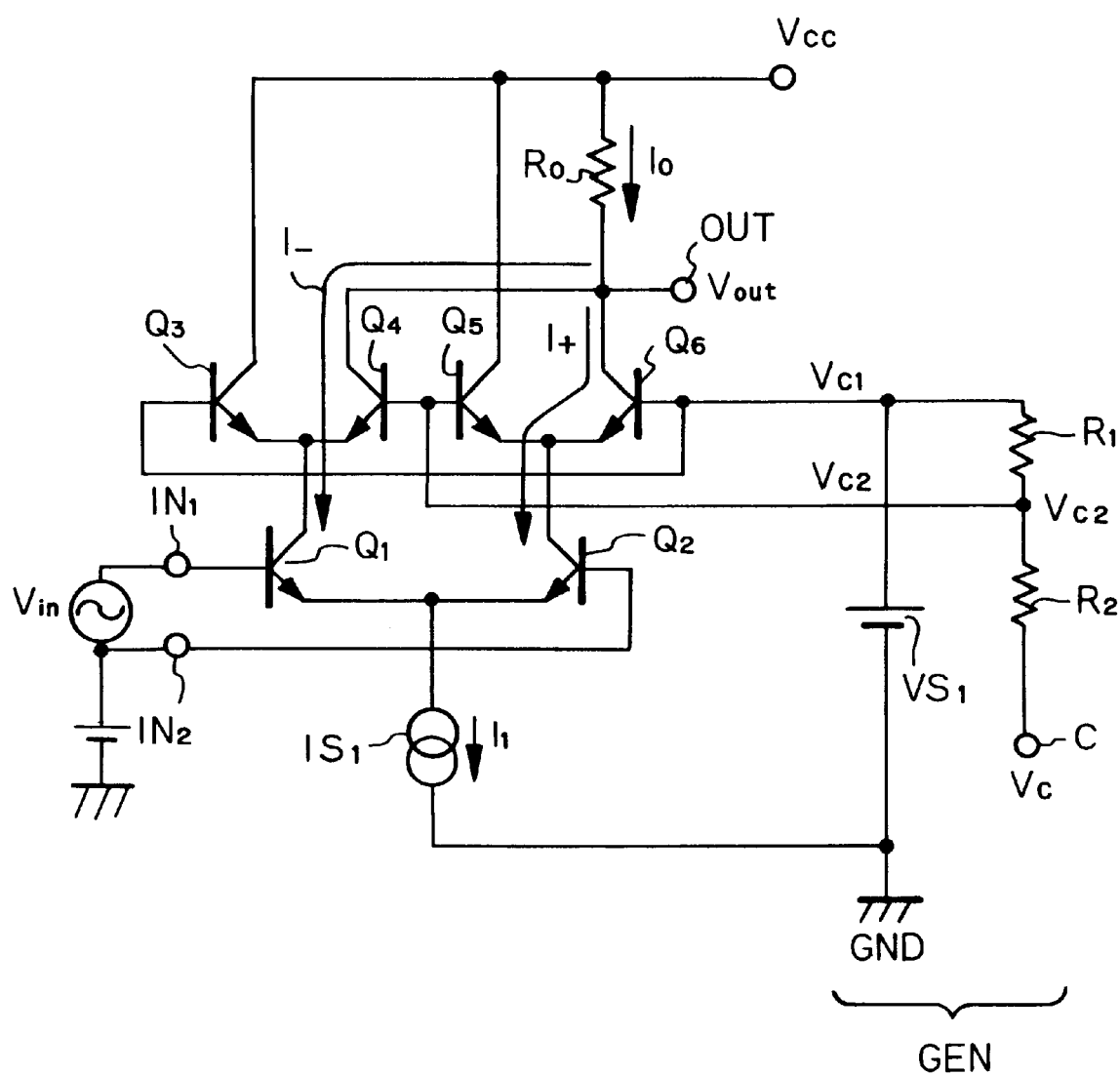
FIG. 1 is a circuit diagram illustrating a prior art gain-variable amplifier.

In FIG. 1, a first differential amplifier is formed by two NPN type transistors $Q_1$ and $Q_2$ having a common emitter connected via a constant current source $IS_1$ whose current is $I_1$ to a ground terminal GND. An AC input voltage $V_{in}$ is applied between input terminals $IN_1$ and $IN_2$, i.e., between the bases of the transistors $Q_1$ and $Q_2$.

The first differential amplifier amplifies the input voltage $V_{in}$.

Also, a second differential amplifier is formed by two NPN type transistors $Q_3$ and $Q_4$ having a common emitter connected to the collector of the transistor $Q_1$. The collector of the transistor $Q_3$ is connected to a power supply terminal $V_{CC}$, while the collector of the transistor $Q_4$ is connected via an output resistor $R_0$ to the power supply terminal $V_{CC}$.

Similarly, a third differential amplifier is formed by two NPN type transistors $Q_5$ and $Q_6$ having a common emitter connected to the collector of the transistor $Q_2$. The collector of the transistor $Q_5$ is connected to the power supply terminal $V_{CC}$, while the collector of the transistor $Q_6$ is connected via the output resistor $R_0$ to the power supply terminal $V_{CC}$.

The output resistor $R_0$ provides an output voltage $V_{out}$ at an output terminal OUT. In this case, a current $I_0$ flowing through the resistor $R_0$ is formed by a negative phase current $I_-$ flowing through the transistor $Q_4$ of the second differential amplifier and the transistor $Q_1$ of the first differential amplifier and a positive phase current $I_+$ flowing through the transistor $Q_6$ of the third differential amplifier and the transistor $Q_2$ of the first differential amplifier. Note that the negative phase current $I_-$ is opposite in phase to the positive phase current $I_+$.

Also, the bases of the transistors $Q_3$ and $Q_6$ receive a first control voltage $V_{C^1}$, while the bases of he transistors $Q_4$ and $Q_5$ receive a second control voltage $V_{C^2}$. The control voltages $V_{C^1}$ and $V_{C^2}$ are generated by a control voltage generating circuit GEN.

The control voltages generating circuit GEN is constructed by a constant voltage source $VS_1$ and a voltage divider formed by two resistors $R_1$ and $R_2$ between the base of the transistor $Q_6$ and a gain control terminal C whose voltage is $V_C$. That is, the control voltage $V_{C^1}$ is generated by the constant voltage source $VS_1$, while the control voltage $V_{C^2}$ is generated by the voltage divider ($R_1$, $R_2$). In this case, $$V_{C^2} = V_{C^1} + (V_C - V_{C^1}) \cdot R_1/(R_1+R_2) \tag{1}$$

Thus, the higher the voltage $V_{C^2}(V_C)$, the larger the negative phase current $I_-$. On the other hand, the lower the voltage $V_{C^2}(V_C)$, the larger the positive phase current $I_+$.

The operation of the gain-variable amplifier of FIG. 1 is explained next in more detail.

If $V_C > V_{C^1}$, i.e., $V_{C^2} > V_{C^1}$, the voltage at the bases of the transistors $Q_3$ and $Q_6$ is higher than the voltage at the bases of the transistors $Q_4$ and $Q_5$. Therefore, the negative phase current $I_-$ is greater than the positive phase current $I_+$. In this state, when the gain control voltage $V_C$ is further increased, the current $I_0$ ($=I_+ + I_-$) is increased. Thus, as shown in FIG. 2, the gain of the gain-variable amplifier of FIG. 1 is increased as the gain control voltage $V_C$ is increased.

On the other hand, if $V_C < V_{C^1}$, i.e., $V_{C^2} < V_{C^1}$, the voltage at the bases of the transistors $Q_4$ and $Q_5$ is higher than the voltage at the bases of the transistors $Q_3$ and $Q_6$. Therefore, the positive phase current $I_+$ is greater than the negative phase current $I_-$. In this state, when the again control voltage $V_C$ is further decreased, the current $I_0$ (=$I_+$+$I_-$) is increased. Thus, as shown in FIG. 2, the gain of the gain-variable amplifier of FIG. 1 is increased as the gain control voltage $V_C$ is decreased.

In addition, if $V_C$=$V_{C^1}$, i.e., $V_{C^2}$=$V_{C^1}$, the voltage at the bases of the transistors $Q_3$ and $Q_6$ is equal to the voltage at the bases of the transistors $Q_4$ and $Q_5$. Therefore, the negative phase current $I_-$ is equal to the positive phase current $I_+$. In this case, since the negative phase current $I_-$ is opposite in phase to the positive phase current $I_+$, so that the negative phase current $I_-$ offsets the positive phase current $I_+$, the current $I_0$ includes only a DC component and is minimum. Thus, as shown in FIG. 2, the gain of the gain-variable amplifier of FIG. 1 is minimum.

Figure 2:
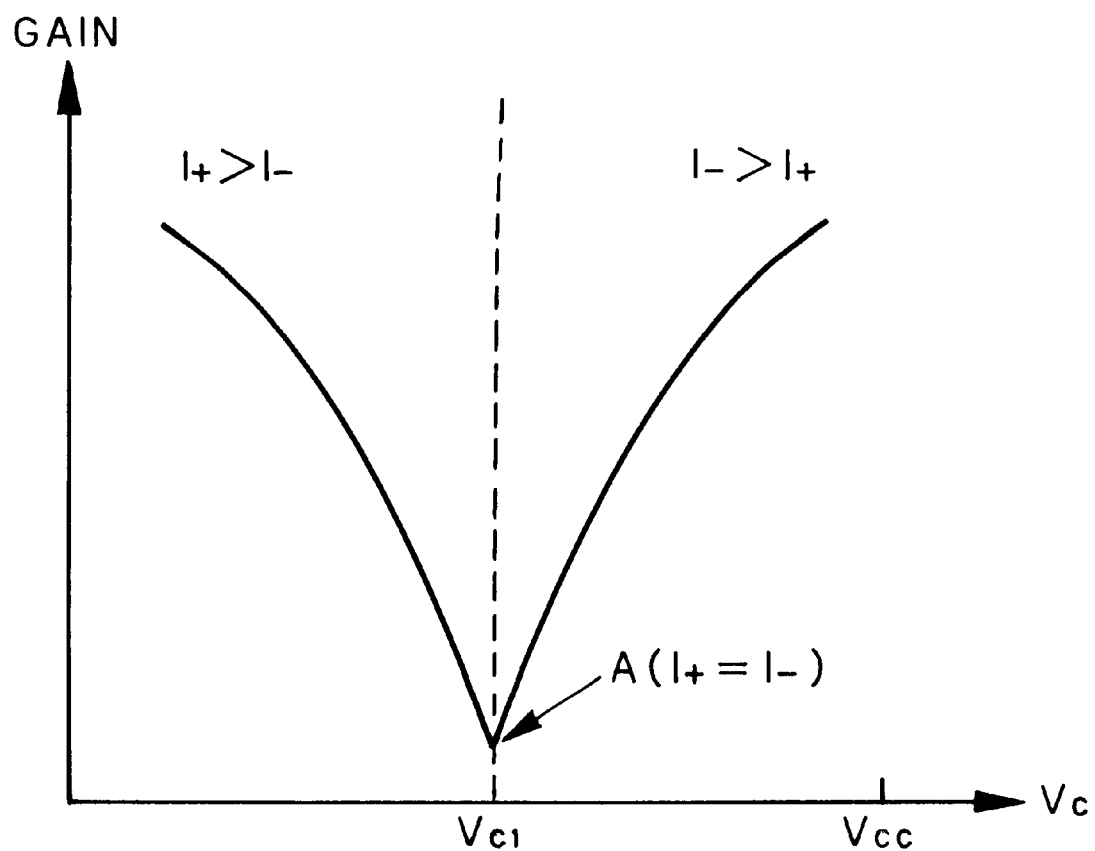
FIG. 2 is a graph showing the gain characteristics of the gain-variable amplifier of FIG. 1.

In the gain-variable amplifier of FIG. 1, since the gain characteristics has an inflection point as indicated by A in FIG. 2, it is difficult to control the gain by the gain control voltage $V_C$. Also, the phase of the output voltage $V_{out}$ is inverted at the inflection point A. Since only a half of the exploitable control range is utilized, the control range is substantially reduced.

Figure 3:
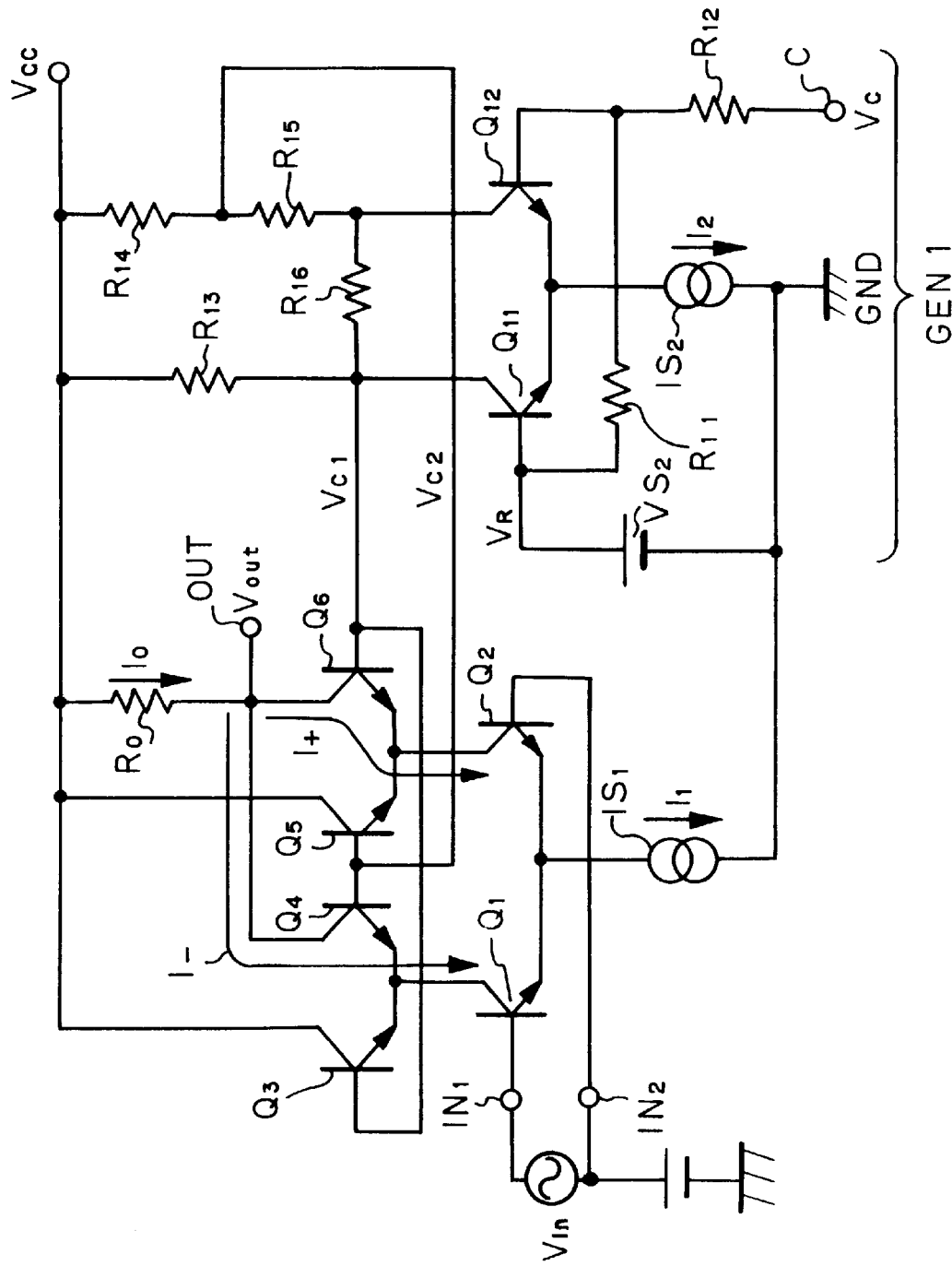
FIG. 3 is a circuit diagram illustrating a first embodiment of the gain-variable amplifier according to the present invention.

In FIG. 3, which illustrates a first embodiment of the present invention, a control voltage generating circuit GEN1 is provided instead of the control voltage generating circuit GEN. The control voltage generating circuit GEN1 is constructed by a differential amplifier formed by NPN type transistors $Q_{11}$ and $Q_{12}$ having a common emitter connected to a constant current source $IS_2$ whose current is $I_2$. The base of the transistor $Q_{11}$ is connected to a constant voltage source $VS_2$ whose voltage is $V_R$, and a voltage divider formed by resistors $R_{11}$ and $R_{12}$ is connected between the base of the transistor $Q_{11}$ and the gain control terminal C.

Also, a resistor $R_{13}$ is connected between the power supply terminal $V_{CC}$ and the collector of the transistor $Q_{11}$, and resistors $R_{14}$ and $R_{15}$ are connected between the power supply terminal $V_{CC}$ and the collector of the transistor $Q_{12}$. Further, a resistor $R_{16}$ is connected between the collectors of the transistors $Q_{11}$ and $Q_{12}$. Here, assume that $$R_{13}=R_{14} \qquad (2)$$

$$R_{15}=R_{16} \qquad (3)$$

The operation of the gain variable amplifier of FIG. 3 is explained next.

If $V_C$=0V (GND), the voltage at the base of the transistor $Q_{11}$ is higher than the voltage at the base of the transistor $Q_{12}$, so that the transistors $Q_{11}$ and $Q_{12}$ are turned ON and OFF, respectively. As a result, the current $I_2$ flows through the transistor $Q_{11}$. In this case, $$V_{C^2}=V_{C^1}+(V_{CC}-V_{C^1})\cdot(R_{15}+R_{16})/(R_{14}+R_{15}+R_{16})>V_{C^1} \qquad (4)$$

Thus, the negative phase current $I_-$ is greater than the positive phase current $I_+$.

Also, if $V_C$=$V_R$, the voltage at the base of the transistor $Q_{11}$ is equal to the voltage at the base of the transistor $Q_{12}$. As a result, a current of $I_2/2$ flows through each of the transistors $Q_{11}$ and $Q_{12}$. Therefore, if a current flowing from the collector of the transistor $Q_{11}$ via the resistor $R_{16}$ to the collector of the transistor $Q_{12}$ is defined by $I_{16}$, $$V_{C^1}=V_{CC}-(I_2/2+I_{16})\cdot R_{13} \qquad (5)$$

$$V_{C^2}=V_{CC}-(I_2/2-I_{16})\cdot R_{14} \qquad (6)$$

Since $R_{13}=R_{14}$ (see formula (2)), from the formulae (5) and (6), $$V_{C^2}>V_{C^1} \qquad (7)$$

Further, if $V_C$=$V_{CC}$, the voltage at the base of the transistor $Q_{11}$ is lower than the voltage at the base of the transistor $Q_{12}$, so that the transistors $Q_{11}$ and $Q_{12}$ are turned OFF and ON, respectively. As a result, the current $I_2$ flows through the transistor $Q_{12}$. Also, in this case, from the formulae (2) and (3), $$R_{13}+R_{16}=R_{14}+R_{15} \qquad (8)$$

Therefore, a current of $I_2/2$ flows through the resistors $R_{13}$ and $R_{16}$, and also, a current of $I_2/2$ flows through the resistors $R_{14}$ and $R_{15}$. Therefore, $$V_{C^1}=V_{CC}-(I_2/2)\cdot R_{13} \qquad (9)$$

$$V_{C^2}=V_{CC}-(I_2/2)\cdot R_{14} \qquad (10)$$

Since $R_{13}=R_{14}$ (see formula (2)), from the formulae (9) and (10), $$V_{C^2}=V_{C^1} \qquad (11)$$

Figure 4:
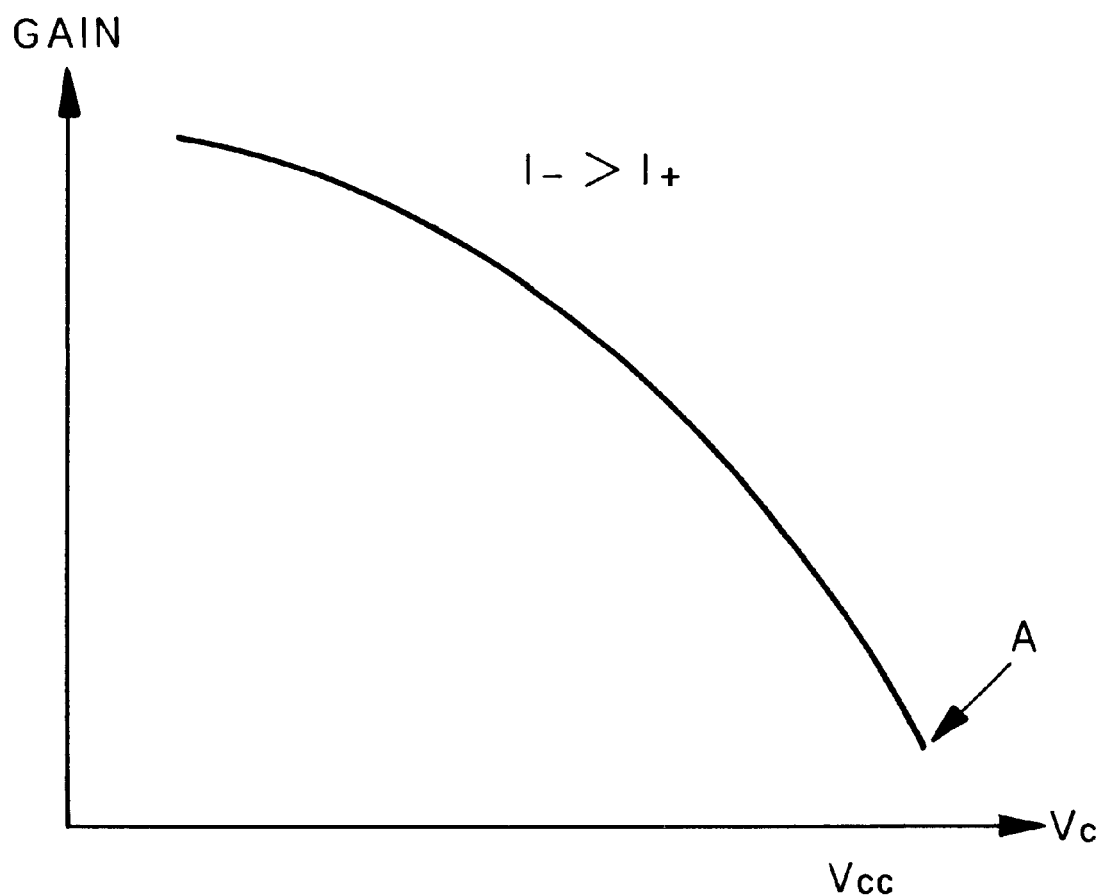
FIG. 4 is a graph showing the gain characteristics of the gain-variable amplifier of FIG. 3.

Therefore, as shown in FIG. 4, the gain of the gain-variable amplifier of FIG. 3 is decreased as the gain control voltage $V_C$ is increased. In this case, since the gain control voltage $V_C$ is from 0V to $V_{CC}$, the negative phase current $I_-$ is greater than the positive phase current $I_+$. Also, when $V_C$=$V_{CC}$, the gain of the gain-variable amplifier of FIG. 3 is minimum as indicated by A in FIG. 4.

Thus, in the gain-variable amplifier of FIG. 3, since the gain characteristics have no inflection point, it is easy to control the gain by the gain control voltage $V_C$. Also, the phase of the output voltage $V_{out}$ is never inverted. Since a full of the exploitable control range can be utilized, the control range of gain by the gain control voltage $V_C$ can be substantially increased.

Figure 5:
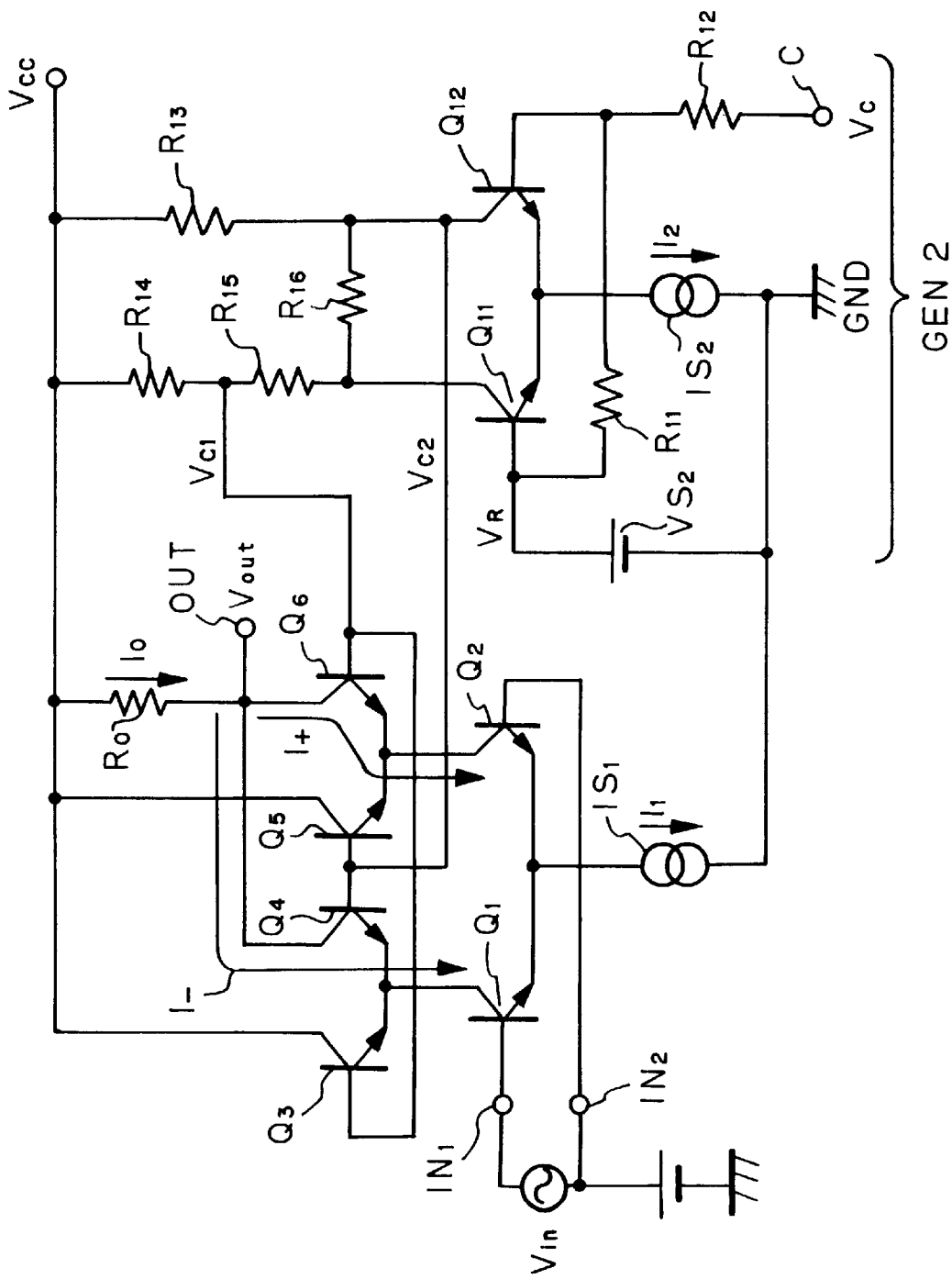
FIG. 5 is a circuit diagram illustrating a second embodiment of the gain-variable amplifier according to the present invention.

In FIG. 5, which illustrates a second embodiment of the present invention, a control voltage generating circuit GEN2 is provided instead of the control voltage generating circuit GEN1 of FIG. 3. In the control voltage generating circuit GEN2, the resistor $R_{13}$ of FIG. 3 is exchanged with the resistors $R_{14}$ and $R_{15}$ of FIG. 3. In other words, the control voltages $V_{C^1}$ and $V_{C^2}$ are exchanged with each other.

The operation of the gain variable amplifier of FIG. 5 is explained next.

If $V_C$=0V(GND), the voltage at the base of the transistor $Q_{11}$ is higher than the voltage at the base of the transistor $Q_{12}$, so that the transistors $Q_{11}$ and $Q_{12}$ are turned ON and OFF, respectively. As a result, the current $I_2$ flows through the transistor $Q_{11}$. Also, in this case, from the formula (8), a current of $I_2/2$ flows through the resistors $R_{13}$ and $R_{16}$, and also, a current of $I_2/2$ flows through the resistors $R_{14}$ and $R_{15}$. Therefore, $$V_{C^1}=V_{CC}-(I_2/2)\cdot R_{13} \qquad (12)$$

$$V_{C^2}=V_{CC}-(I_2/2)\cdot R_{14} \qquad (13)$$

Since $R_{13}=R_{14}$ (see formula (2)), from the formulae (12) and (13), $$V_{C^2}=V_{C^1} \qquad (14)$$

Also, if $V_C$=$V_R$, the voltage at the base of the transistor $Q_{11}$ is equal to the voltage at the base of the transistor $Q_{12}$. As a result, a current of $I_2/2$ flows through each of the transistors $Q_{11}$ and Q12. Therefore, $$V_C{}^1 = V_{CC} - (I_2/2 - I_{16}) \cdot R_{13} \quad (15)$$

$$V_C{}^2 = V_{CC} - (I_2/2 + I_{16}) \cdot R_{14} \quad (16)$$

Since $R_{13}=R_{14}$ (see formula (2)), from the formulae (15) and (16), $$V_C{}^2 < V_C{}^1 \quad (17)$$

Further, if $V_C = V_{CC}$, the voltage at the base of the transistor $Q_{11}$ is lower than the voltage at the base of the transistor $Q_{12}$, so that the transistors $Q_{11}$ and $Q_{12}$ are turned OFF and ON, respectively. As a result, the current $I_2$ flows through the transistor $Q_{12}$. In this case, $$V_C{}^1 = V_C{}^2 + (V_{CC} - V_C{}^2) \cdot (R_{15} + R_{16})/(R_{14} + R_{15} + R_{16}) > V_C{}^2 \quad (18)$$

Thus, the positive phase current $I_+$ is greater than the negative phase current $I_-$.

Figure 6:
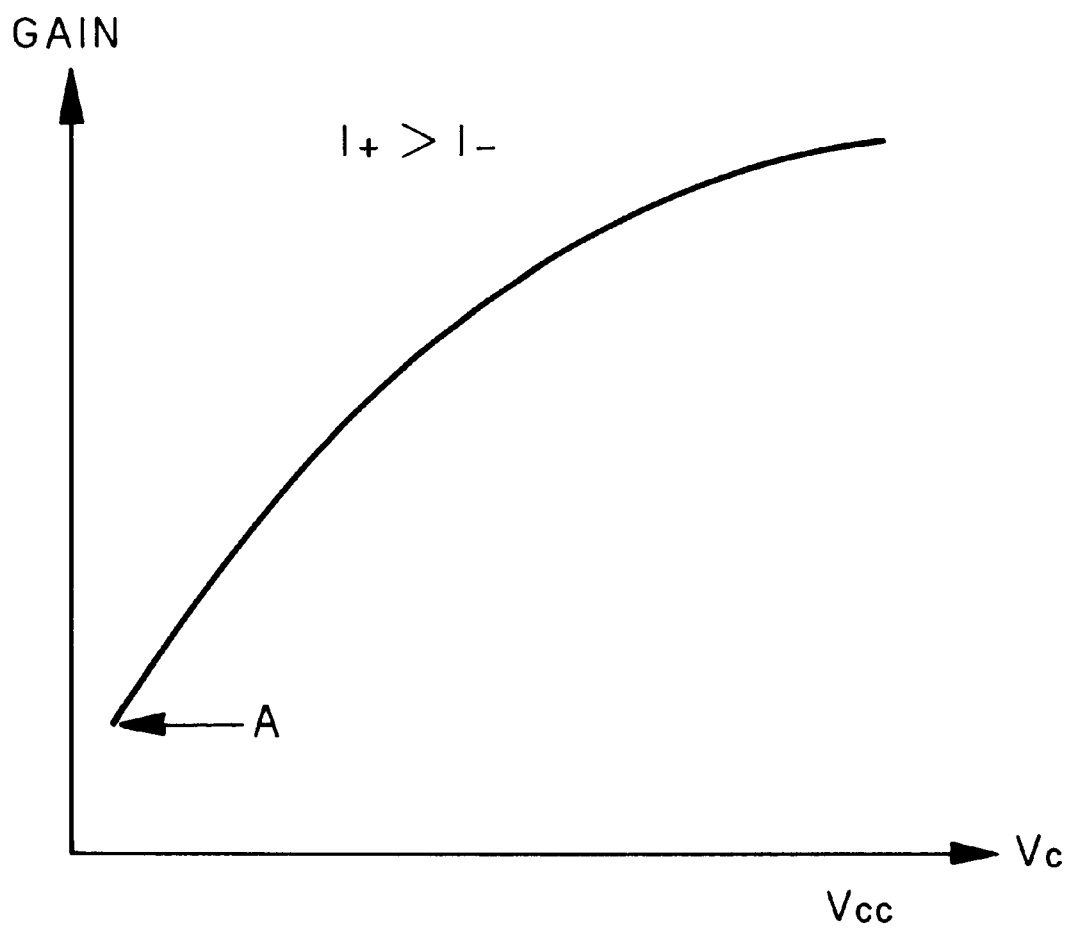
FIG. 6 is a graph showing the gain characteristics of the gain-variable amplifier of FIG. 5.

Therefore, as shown in FIG. 6, the gain of the gain-variable amplifier of FIG. 5 is increased as the gain control voltage $V_C$ is increased. In this case, the gain control voltage $V_C$ is from 0V to $V_{CC}$, the positive phase current $I_+$ is greater than the negative phase current $I_-$. Also, when $V_C = 0V$, the gain of the gain-variable amplifier of FIG. 5 is minimum as indicated by A in FIG. 6.

Thus, in the gain-variable amplifier of FIG. 5, since the gain characteristics have no inflection point, it is easy to control the gain by the gain control voltage $V_C$. Also, the phase of the output voltage $V_{out}$ is never inverted. Since a full of the exploitable control range can be utilized, the control range of gain by the gain control voltage $V_C$ can be substantially increased.

Figure 7:
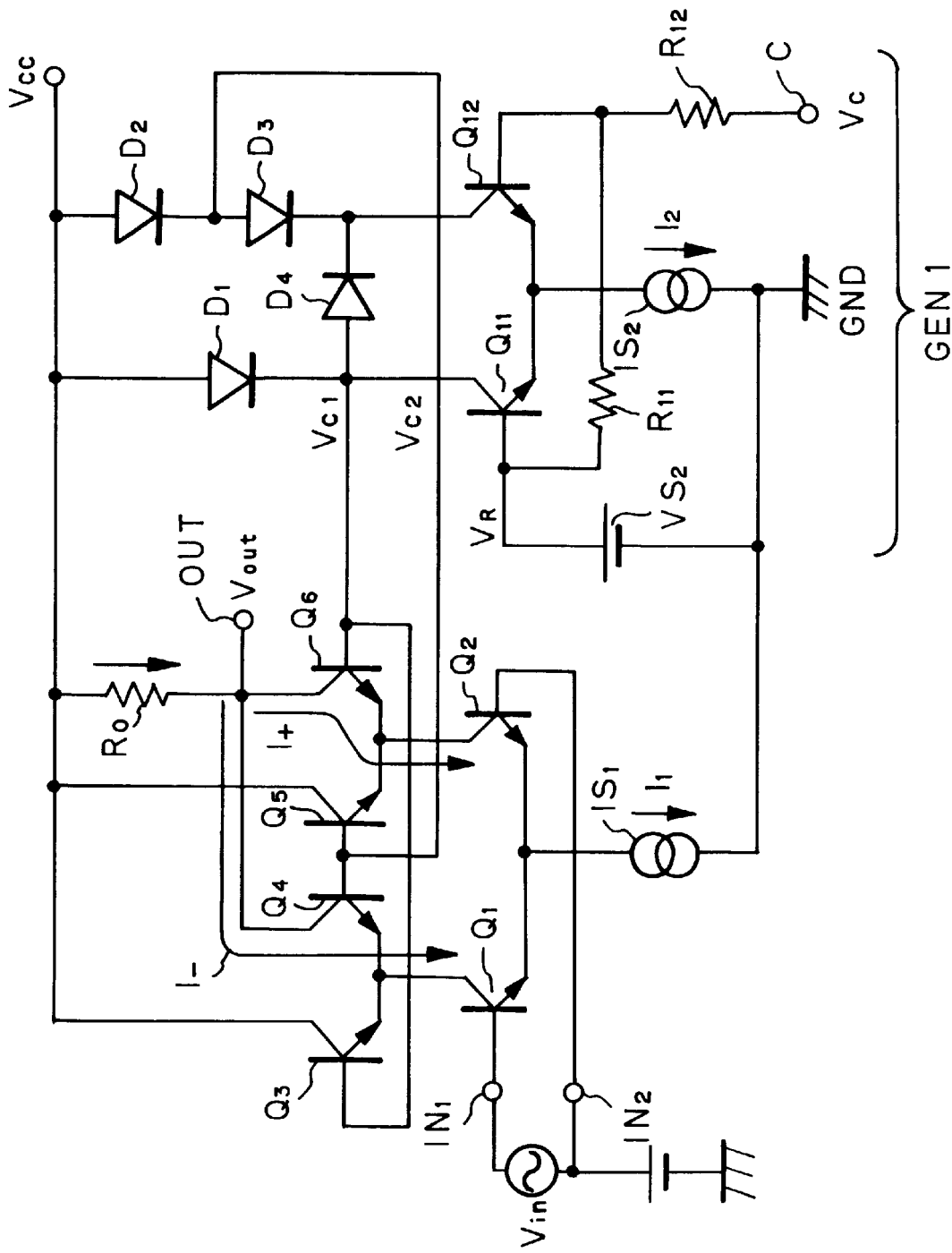
FIG. 7 is a circuit diagram illustrating a third embodiment of the gain-variable amplifier according to the present invention.

In FIG. 7, which illustrates a third embodiment of the present invention, the resistors $R_{13}$, $R_{14}$, $R_{15}$ and $R_{16}$ of FIG. 3 are replaced by diodes $D_1$, $D_2$, $D_3$ and $D_4$, respectively. In this case, the values of the resistors $R_{13}$, $R_{14}$, $R_{15}$ and $R_{16}$ of FIG. 3 are replaced by the saturation currents of the diodes $D_1$, $D_2$, $D_3$ and $D_4$, respectively. That is, the saturation current of the diode $D_1$ is equal to that of the diode $D_2$, and the saturation current of the diode $D_3$ is equal to that of the diode $D_4$. Thus, the operation of the gain-variable amplifier of FIG. 7 is the same as that of the gain-variable amplifier of FIG. 3.

Figure 8:
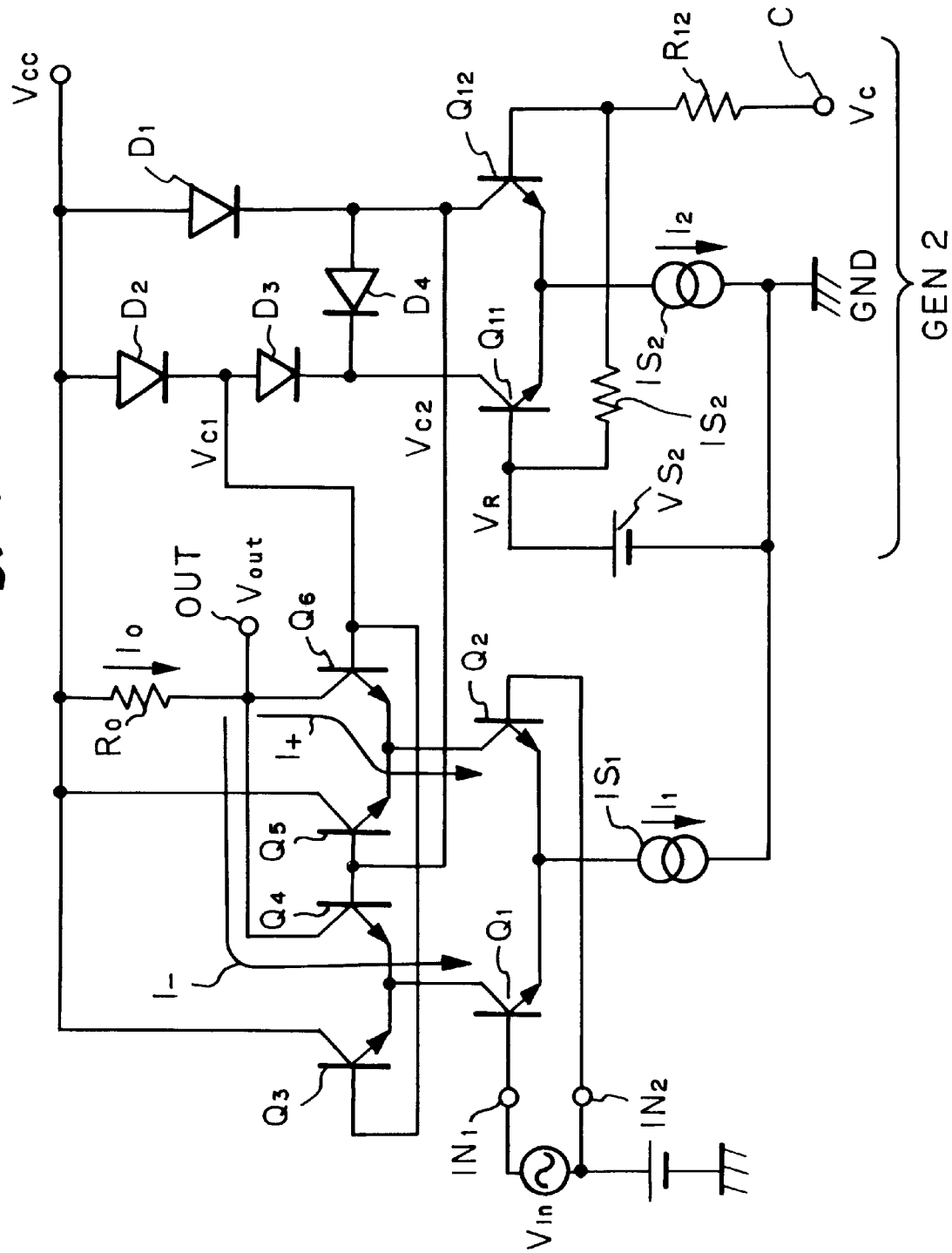
FIG. 8 is a circuit diagram illustrating a fourth embodiment of the gain-variable amplifier according to the present invention.

In FIG. 8, which illustrates a fourth embodiment of the present invention, the resistors $R_{13}$, $R_{14}$, $R_{15}$ and $R_{16}$ of FIG. 5 are replaced by diodes $D_1$, $D_2$, $D_3$ and $D_4$, respectively. Also, in this case, the values of the resistors $R_{13}$, $R_{14}$, $R_{15}$ and $R_{16}$ of FIG. 5 are replaced by the saturation currents of the diodes $D_1$, $D_2$, $D_3$ and $D_4$, respectively. That is, the saturation current of the diode $D_1$ is equal to that of the diode $D_2$, and the saturation current of the diode $D_3$ is equal to that of the diode $D_4$. Thus, the operation of the gain-variable amplifier of FIG. 8 is the same as that of the gain-variable amplifier of FIG. 5.

As explained hereinabove, according to the present invention, since the gain characteristics have no inflection point, it is easy to control the gain by the gain control voltage. Also, the phase of the output voltage is never inverted. As a result, a control range of gain by the gain control voltage can be substantially increased.

I claim:

1. A gain-variable amplifier comprising:

first and second power supply terminals;

a first differential amplifier, connected to said first power supply terminal, for amplifying an input voltage, said first differential amplifier having first and second outputs;

a second differential amplifier, connected to the first output, for amplifying a difference between a first control voltage and a second control voltage, said second differential amplifier having a third output connected to said second power supply terminal and a fourth output;

a third differential amplifier, connected to the second output, for amplifying a difference between said second control voltage and said first control voltage, said third differential amplifier having a fifth output connected to said second power supply terminal and a sixth output connected to said fourth output;

an output resistor connected between said fourth output and said second power supply terminal; and a control voltage generating circuit, connected to said second and third differential amplifiers, for generating said first and second control voltages in accordance with a gain control voltage, so that a polarity of the difference between said first and second control voltages is unchanged when said gain control voltage is changed between a voltage at said first power supply terminal and a voltage at said second power supply terminal, wherein said control voltage generating circuit comprises:

a fourth differential amplifier formed by first and second transistors connected via a constant current source to said first power supply terminal, a base of said first transistor receiving a reference voltage, a base of said second transistor receiving said gain control voltage, said third differential amplifier having a seventh output for generating said first control voltage and an eighth output;

a first resistor connected between said seventh output and said second power supply terminal;

a second resistor connected to said second power supply terminal;

a third resistor connected between said eighth output and said second resistor, a node between said second and third resistors generating said second control voltage; and a fourth resistor connected between said seventh and eighth outputs.

2. The variable-gain amplifier as set forth in claim 1, wherein a resistance value of said first resistor is equal to a resistance value of said second resistor, a resistance value of said third resistor being equal to a resistance value of said fourth resistor.

3. A gain-variable amplifier comprising:

first and second power supply terminals;

a first differential amplifier, connected to said first power supply terminal, for amplifying an input voltage, said first differential amplifier having first and second outputs;

a second differential amplifier, connected to the first output, for amplifying a difference between a first control voltage and a second control voltage, said second differential amplifier having a third output connected to said second power supply terminal and a fourth output;

a third differential amplifier, connected to the second output, for amplifying a difference between said second control voltage and said first control voltage, said third differential amplifier having a fifth output connected to said second power supply terminal and a sixth output connected to said fourth output;

an output resistor connected between said fourth output and said second power supply terminal; and a control voltage generating circuit, connected to said second and third differential amplifiers, for generating said first and second control voltages in accordance with a gain control voltage, so that a polarity of the difference between said first and second control voltages is unchanged when said gain control voltage is changed between a voltage at said first power supply terminal and a voltage at said second power supply terminal, wherein said control voltage generating circuit comprises:

a third differential amplifier formed by first and second transistors connected via a constant current source to said first power supply terminal, a base of said first transistor receiving a reference voltage, a base of said second transistor receiving said gain control voltage, said third differential amplifier having a seventh output and an eighth output for generating said second control voltage;

a first resistor connected between said eighth output and said second power supply terminal;

a second resistor connected to said second power supply terminal;

a third resistor connected between said seventh output and said second resistor, a node between said second and third resistors generating said first control voltage; and a fourth resistor connected between said seventh and eighth outputs.

4. The variable-gain amplifier as set forth in claim 3, wherein a resistance value of said first resistor is equal to a resistance value of said second resistor, a resistance value of said third resistor being equal to a resistance value of said fourth resistor.

5. A gain-variable amplifier comprising:

first and second power supply terminals;

a first differential amplifier, connected to said first power supply terminal, for amplifying an input voltage, said first differential amplifier having first and second outputs;

a second differential amplifier, connected to the first output, for amplifying a difference between a first control voltage and a second control voltage, said second differential amplifier having a third output connected to said second power supply terminal and a fourth output;

a third differential amplifier, connected to the second output, for amplifying a difference between said second control voltage and said first control voltage, said third differential amplifier having a fifth output connected to said second power supply terminal and a sixth output connected to said fourth output;

an output resistor connected between said fourth output and said second power supply terminal; and a control voltage generating circuit, connected to said second and third differential amplifiers, for generating said first and second control voltages in accordance with a gain control voltage, so that a polarity of the difference between said first and second control voltages is unchanged when said gain control voltage is changed between a voltage at said first power supply terminal and a voltage at said second power supply terminal, wherein said control voltage generating circuit comprises:

a third differential amplifier formed by first and second transistors connected via a constant current source to said first power supply terminal, a base of said first transistor receiving a reference voltage, a base of said second transistor receiving said gain control voltage, said third differential amplifier having a seventh output for generating said first control voltage and an eighth output;

a first diode connected between said seventh output and said second power supply terminal;

a second diode connected to said second power supply terminal;

a third diode connected between said eighth output and said second diode, a node between said second and third diodes generating said second control voltage; and a fourth diode connected between said seventh and eighth outputs.

6. The variable-gain amplifier as set forth in claim 5, wherein a saturation current value of said first diode is equal to a saturation current value of said second diode, a saturation current value of said third diode being equal to a saturation current value of said fourth resistor.

7. A gain-variable amplifier comprising:

first and second power supply terminals;

a first differential amplifier, connected to said first power supply terminal, for amplifying an input voltage, said first differential amplifier having first and second outputs;

a second differential amplifier, connected to the first output, for amplifying a difference between a first control voltage and a second control voltage, said second differential amplifier having a third output connected to said second power supply terminal and a fourth output;

a third differential amplifier, connected to the second output, for amplifying a difference between said second control voltage and said first control voltage, said third differential amplifier having a fifth output connected to said second power supply terminal and a sixth output connected to said fourth output;

an output resistor connected between said fourth output and said second power supply terminal; and a control voltage generating circuit, connected to said second and third differential amplifiers, for generating said first and second control voltages in accordance with a gain control voltage, so that a polarity of the difference between said first and second control voltages is unchanged when said gain control voltage is changed between a voltage at said first power supply terminal and a voltage at said second power supply terminal, wherein said control voltage generating circuit comprises:

a third differential amplifier formed by first and second transistors connected via a constant current source to said first power supply terminal, a base of said first transistor receiving a reference voltage, a base of said second transistor receiving said gain control voltage, said third differential amplifier having a seventh output and an eighth output for generating said second control voltage;

a first diode connected between said eighth output and said second power supply terminal;

a second diode connected to said second power supply terminal;

a third diode connected between said seventh output and said second diode, a node between said second and third diodes generating said first control voltage; and a fourth diode connected between said seventh and eighth outputs.

8. The variable-gain amplifier as set forth in claim 7, wherein a saturation current value of said first diode is equal to a saturation current value of said second diode,
   a saturation current value of said third diode being equal to a saturation current value of said fourth diode.

9. A gain-variable amplifier comprising:
   a dual differential amplifier circuit for amplifying an input voltage to generate an output voltage with a gain in accordance with a difference between first and second control voltages;
   a control voltage generating circuit, connected to said dual differential amplifier, for generating said first and second control voltages in accordance with a gain control voltage, so that a polarity of said difference between said first and second control voltages is unchanged when said gain control voltage is within a control range.

10. A gain-variable amplifier comprising:
    a dual differential amplifier circuit for amplifying an input voltage to generate an output voltage with a gain in accordance with first and second control voltages;
    a control voltage generating circuit, connected to said dual differential amplifier, for generating said first and second control voltages in accordance with a gain control voltage, so that a polarity of difference between said first and second control voltages is unchanged when said gain control voltage is within a control range, wherein said control voltage generating circuit comprises:
       a differential amplifier formed by first and second transistors connected via a constant current source to a first power supply terminal, a base of said first transistor receiving a reference voltage, a base of said second transistor receiving said gain control voltage, said differential amplifier having a first output for generating said first control voltage and a second output;
       a first resistor connected between said first output and a second power supply terminal;
       a second resistor connected to said second power supply terminal;
       a third resistor connected between said second output and said second resistor, a node between said second and third resistors generating said second control voltage; and
       a fourth resistor connected between said first and second outputs.

11. The variable-gain amplifier as set forth in claim 10, wherein a resistance value of said first resistor is equal to a resistance value of said second resistor,
    a resistance value of said third resistor being equal to a resistance value of said fourth resistor.

12. A gain-variable amplifier comprising:
    a dual differential amplifier circuit for amplifying an input voltage to generate an output voltage with a gain in accordance with first and second control voltages;
    a control voltage generating circuit, connected to said dual differential amplifier, for generating said first and second control voltages in accordance with a gain control voltage, so that a polarity of difference between said first and second control voltages is unchanged when said gain control voltage is within a control range, wherein said control voltage generating circuit comprises:
       a differential amplifier formed by first and second transistors connected via a constant current source to a first power supply terminal, a base of said first transistor receiving a reference voltage, a base of said second transistor receiving said gain control voltage, said differential amplifier having a first output and a second output for generating said second control voltage;
       a first resistor connected between said second output and a second power supply terminal;
       a second resistor connected to said second power supply terminal;
       a third resistor connected between said first output and said second resistor, a node between said second and third resistors generating said first control voltage; and
       a fourth resistor connected between said first and second outputs.

13. The variable-gain amplifier as set forth in claim 12, wherein a resistance value of said first resistor is equal to a resistance value of said second resistor,
    a resistance value of said third resistor being equal to a resistance value of said fourth resistor.

14. A gain-variable amplifier comprising:
    a dual differential amplifier circuit for amplifying an input voltage to generate an output voltage with a gain in accordance with first and second control voltages;
    a control voltage generating circuit, connected to said dual differential amplifier, for generating said first and second control voltages in accordance with a gain control voltage, so that a polarity of difference between said first and second control voltages is unchanged when said gain control voltage is within a control range, wherein said control voltage generating circuit comprises:
       a differential amplifier formed by first and second transistors connected via a constant current source to a first power supply terminal, a base of said first transistor receiving a reference voltage, a base of said second transistor receiving said gain control voltage, said third differential amplifier having a first output for generating said first control voltage and a second output;
       a first diode connected between said seventh output and a second power supply terminal;
       a second diode connected to said second power supply terminal;
       a third diode connected between said second output and said second diode, a node between said second and third diodes generating said second control voltage; and
       a fourth diode connected between said first and second outputs.

15. The variable-gain amplifier as set forth in claim 14, therein a saturation current value of said first diode is equal to a saturation current value of said second diode,
    a saturation current value of said third diode being equal to a saturation current value of said fourth resistor.

16. A gain-variable amplifier comprising:
    a dual differential amplifier circuit for amplifying an input voltage to generate an output voltage with a gain in accordance with first and second control voltages;
    a control voltage generating circuit, connected to said dual differential amplifier, for generating said first and second control voltages in accordance with a gain control voltage, so that a polarity of difference between said first and second control voltages is unchanged when said gain control voltage is within a control range, wherein said control voltage generating circuit comprises:
- a differential amplifier formed by first and second transistors connected via a constant current source to a first power supply terminal, a base of said first transistor receiving a reference voltage, a base of said second transistor receiving said gain control voltage, said differential amplifier having a first output and a second output for generating said second control voltage;
- a first diode connected between said second output and a second power supply terminal;
- a second diode connected to said second power supply terminal;
- a third diode connected between said first output and said second diode, a node between said second and third diodes generating said first control voltage; and
- a fourth diode connected between said first and second outputs.

17. The variable-gain amplifier as set forth in claim 16, wherein a saturation current value of said first diode is equal to a saturation current value of said second diode,
a saturation current value of said third diode being equal to a saturation current value of said fourth diode.

* * * * *